(12) United States Patent
Gonzalez et al.

(10) Patent No.: US 11,194,280 B2
(45) Date of Patent: Dec. 7, 2021

(54) INTERLOCK CIRCUIT

(71) Applicant: HEWLETT-PACKARD DEVELOPMENT COMPANY, L.P., Spring, TX (US)

(72) Inventors: Javier Gonzalez, Terrassa (ES); David Soriano, Terrassa (ES); Sergi Ulldemolins, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 451 days.

(21) Appl. No.: 15/748,282

(22) PCT Filed: Oct. 29, 2015

(86) PCT No.: PCT/EP2015/075119
§ 371 (c)(1),
(2) Date: Jan. 29, 2018

(87) PCT Pub. No.: WO2017/071758
PCT Pub. Date: May 4, 2017

(65) Prior Publication Data
US 2018/0217545 A1 Aug. 2, 2018

(51) Int. Cl.
*H03K 17/284* (2006.01)
*H03K 17/689* (2006.01)
(Continued)

(52) U.S. Cl.
CPC ........ *G03G 15/5012* (2013.01); *B41J 29/387* (2013.01); *G05B 9/02* (2013.01);
(Continued)

(58) Field of Classification Search
CPC ... G03G 15/55; G03G 15/5012; B41J 29/387; H03K 17/102; H03K 5/24; G05B 9/02
See application file for complete search history.

(56) References Cited

U.S. PATENT DOCUMENTS 6,766,266 B1 * 7/2004 Sakaguchi ....... G01R 31/31924
324/523
7,420,338 B2 9/2008 Ribarich
(Continued)

FOREIGN PATENT DOCUMENTS

EP 2447783 5/2012
JP 2001216857 8/2001

OTHER PUBLICATIONS

Safety Interlock With Delay Function for Wire Dot Printer by IBM (Year: 1992).*
(Continued)

*Primary Examiner* — Jared Fureman
*Assistant Examiner* — Esayas G Yeshaw
(74) *Attorney, Agent, or Firm* — HP Inc. Patent Department

(57) ABSTRACT

An interlock circuit comprises a plurality of semiconductor switching units electrically connected or connectable in series in a supply line, a plurality of control units electrically connected to the plurality of semiconductor switching units, and a trigger unit electrically connected to the plurality of control circuits. Each control unit activates or deactivates a corresponding semiconductor switching unit in response to trigger signal received from the trigger unit.

20 Claims, 5 Drawing Sheets

(51) Int. Cl.
*G03G 15/00* (2006.01)
*H03K 17/10* (2006.01)
*B41J 29/387* (2006.01)
*G05B 9/02* (2006.01)
*H03K 5/24* (2006.01)

(52) U.S. Cl.
CPC ............ *H03K 5/24* (2013.01); *H03K 17/102* (2013.01); *G03G 15/55* (2013.01)

(56) References Cited

U.S. PATENT DOCUMENTS

| | | | |
|---|---|---|---|
| 7,547,087 B2 | 6/2009 | Cato et al. | |
| 9,273,981 B1* | 3/2016 | Downey | B64C 39/024 |
| 9,997,889 B1* | 6/2018 | Tiemann | H01S 3/1305 |
| 2002/0183616 A1* | 12/2002 | Toews | A61M 5/007 |
| | | | 600/432 |
| 2011/0076046 A1 | 3/2011 | Young | |
| 2011/0311237 A1* | 12/2011 | Hotogi | G03G 15/80 |
| | | | 399/9 |
| 2012/0053867 A1 | 3/2012 | Dunn et al. | |
| 2012/0153974 A1* | 6/2012 | Hashimoto | G01R 31/2621 |
| | | | 324/750.01 |
| 2014/0190453 A1 | 7/2014 | Qiao et al. | |
| 2014/0252992 A1* | 9/2014 | Radermacher | H05B 33/0815 |
| | | | 315/307 |
| 2015/0009717 A1* | 1/2015 | Chen | H02M 3/33507 |
| | | | 363/21.02 |
| 2015/0015300 A1 | 1/2015 | Simonson et al. | |
| 2015/0015321 A1* | 1/2015 | Dribinsky | H03K 17/284 |
| | | | 327/394 |
| 2016/0194017 A1* | 7/2016 | Schmale | B61L 15/0081 |
| | | | 701/19 |

OTHER PUBLICATIONS

Wu, et al; "Anomaly Detection and Degradation Prediction of MOSFET"; Dec. 24, 2014; http://www.hindawi.com/journals/mpe/2015/573980/.

"Safety Interlock with Delay Function for Wire Dot Printer"; IMB Technical Disclosure Bulletin; vol. 35, No. 7, pp. 210-212; Dec. 1992.

* cited by examiner

INTERLOCK CIRCUIT

BACKGROUND

Printing devices often comprise a safety interlock system adapted to deactivate or switch off moving parts in case of risk or danger. For instance, the interlock system may be triggered by a sensor, such as when a user inadvertently opens a cover of the paper feeding mechanism of the printing device during the printing process. The interlock system then instantly stops the paper feeding mechanism so as to prevent harm or injury to the user.

Some safety interlock systems rely on mechanical switching relays. Mechanical switching relays are known to be reliable, but have limited lifespans, can generate current spikes when connecting or disconnecting capacitive or inductive loads, and are ultimately expensive to fabricate.

DETAILED DESCRIPTION

Specific examples of an interlock circuit and method according to the present disclosure will now be described in further detail with reference to the accompanying drawings.

Figure 1:
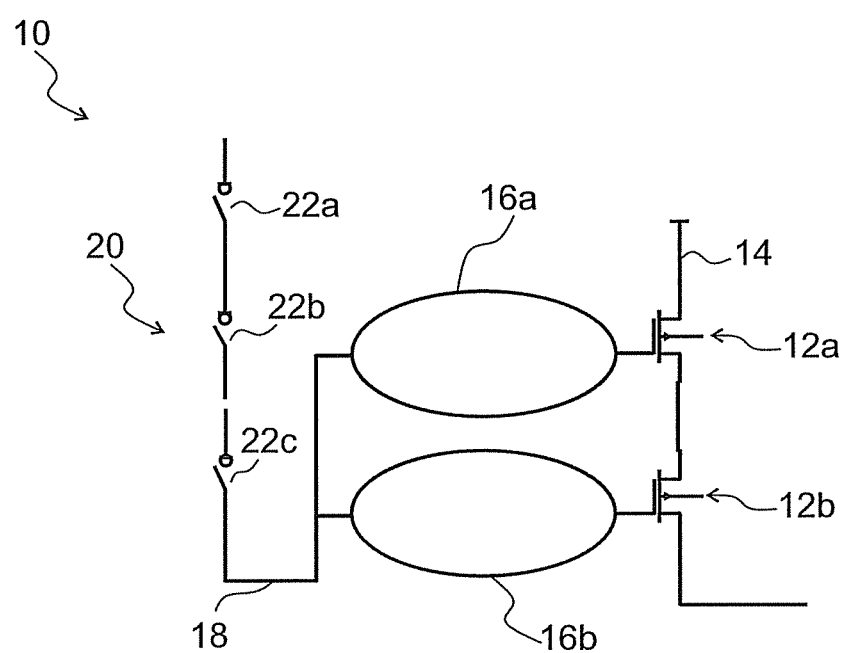
FIG. 1 is a schematic illustration of an example interlock circuit.

FIG. 1 is a schematic illustration of an interlock circuit 10 according to an example of the present disclosure. The interlock circuit 10 comprises two semiconductor transistor elements 12a, 12b connected in series in a power supply line 14 of an electrical appliance (not shown). The electrical appliance may be a paper feeding mechanism of a printing device. However, this is just an example, and the interlock circuit 10 may be employed to provide a safety interlock in a large variety of electrical appliances or machinery.

The power supply line 14 may form part of the electric circuitry or control circuitry of said electrical appliance, and may for instance provide electric power to said paper feeding mechanism of said printing device.

As can be further taken from FIG. 1, the interlock circuit 10 comprises a first control unit 16a electrically connected to a gate electrode of the first semiconductor transistor element 12a, and a second control unit 16b electrically connected to a gate electrode of the second semiconductor transistor element 12b. The first control unit 16a and first semiconductor transistor element 12a establish a first interlock path, and the second control unit 16b and second semiconductor 12b establish a second interlock path. The first and second interlock path can be connected in parallel in said interlock circuit 10.

In further detail, both the first control unit 16a and the second control unit 16b can be connected in parallel via a trigger line 18 to a trigger unit 20 comprising three switch elements 22a, 22b, 22c connected in series. For instance, each of the switch elements 22a, 22b, 22c may be associated with a corresponding cover or lid of a paper feeding mechanism of the printing device. FIG. 1 shows a trigger unit 20 with three switch elements 22a, 22b, 22c. However, this is a mere example, and in general the trigger unit 20 may comprise a smaller or larger number of switch elements.

In normal operation of the printing device, all the lids and covers of the printing device are closed, which may correspond to each of the switch elements 22a, 22b, 22c being in a closed state. In case all the switch elements 22a, 22b, 22c are closed, the first control unit 16a and the second control unit 16b may apply respective control signals to the first semiconductor transistor element 12a and the second semiconductor transistor element 12b to close the semiconductor transistor elements, thereby enabling a current flow in the supply line 14. The printing device may hence be activated.

If, however, a user on purpose or accidentally opens a lid or cover of the paper feeding mechanism of the printing device, the corresponding switch element 22a, 22b, or 22c will open, leading to an interruption of the current in the trigger line 18. This interruption constitutes a trigger signal provided from the trigger unit 20 via the trigger line 18 to the first control unit 16a and second control unit 16b. In response to the trigger signal, the first control unit 16a deactivates the first corresponding semiconductor transistor element 12a, and the second control unit 16b deactivates the corresponding second semiconductor transistor element 12b, thereby interrupting the supply line 14 at the positions of the first and second semiconductor transistor elements 12a, 12b. The interruption of the supply line 14 may instantly stop the paper feeding mechanism of a printing device, and will hence prevent harm or injury that could occur if the user came into physical contact with the moving parts of the paper feeding mechanism.

As can be taken from FIG. 1, each of the first control unit 16a and second control unit 16b independently deactivates the corresponding first semiconductor transistor element 12a and second semiconductor transistor element 12b, respectively. Since the first semiconductor transistor element 12a and the second semiconductor transistor element 12b can be connected in series in the supply line 14, a deactivation of either the first semiconductor transistor element 12a or the second semiconductor transistor element 12b would be sufficient to interrupt and deactivate the electrical appliance. However, the presence of two independent interlock paths via the first control unit 16a and the first semiconductor transistor element 12a on the one hand, and the second control unit 16b and the second semiconductor transistor element 12b on the other hand provides redundancy and can help ensure a reliable safety interlock even in situations in which either the first semiconductor transistor element 12a and/or the first control unit 16a, or the second semiconductor transistor element 12b and/or the second control unit 16b should fail.

Hence, by providing the first and second semiconductor transistor elements 12a, 12b and the first and second control units 16a, 16b redundantly, the reliability of the interlock circuit 10 can be significantly enhanced. For instance, assuming that a failure occurs with a probability p in the first interlock path comprising the first semiconductor transistor element 12a and the first control unit 16a or in the second interlock path comprising the second semiconductor transistor element 12b and the second control unit 16b, and assuming that failures affect the first control path and the second control path independently, the probability of a failure of the entire interlock circuit 10 is reduced from p to $p^2$.

A spatial separation between the first semiconductor transistor element 12a and the second semiconductor transistor element 12b may reduce the likelihood that failures affect both the first and second semiconductor transistor elements 12a, 12b at the same time. For instance, the failure tolerance may be significantly enhanced by ensuring a minimum spatial separation of 2.5 mm between the first semiconductor transistor element 12a and the second semiconductor transistor element 12b.

Similarly, a minimum spatial separation of 2.5 mm between the first control unit 16a and the second control unit 16b may prevent failures or malfunctions that simultaneously affect both the first and second control units 16a, 16b.

FIG. 1 shows a configuration of an interlock circuit 10 with two semiconductor transistor elements 12a, 12b and two control units 16a, 16b. However, this is a mere example, and in general the interlock circuit 10 may comprise a larger number of semiconductor transistor elements arranged in series in the supply line 14, and a corresponding plurality of control units, thereby establishing a larger number of independent interlock paths. Given that one single interlock path is sufficient to interrupt the supply line 14, the reliability and failure tolerance of the interlock circuit 10 can be further enhanced by increasing the number of independent interlock paths.

Figure 2:
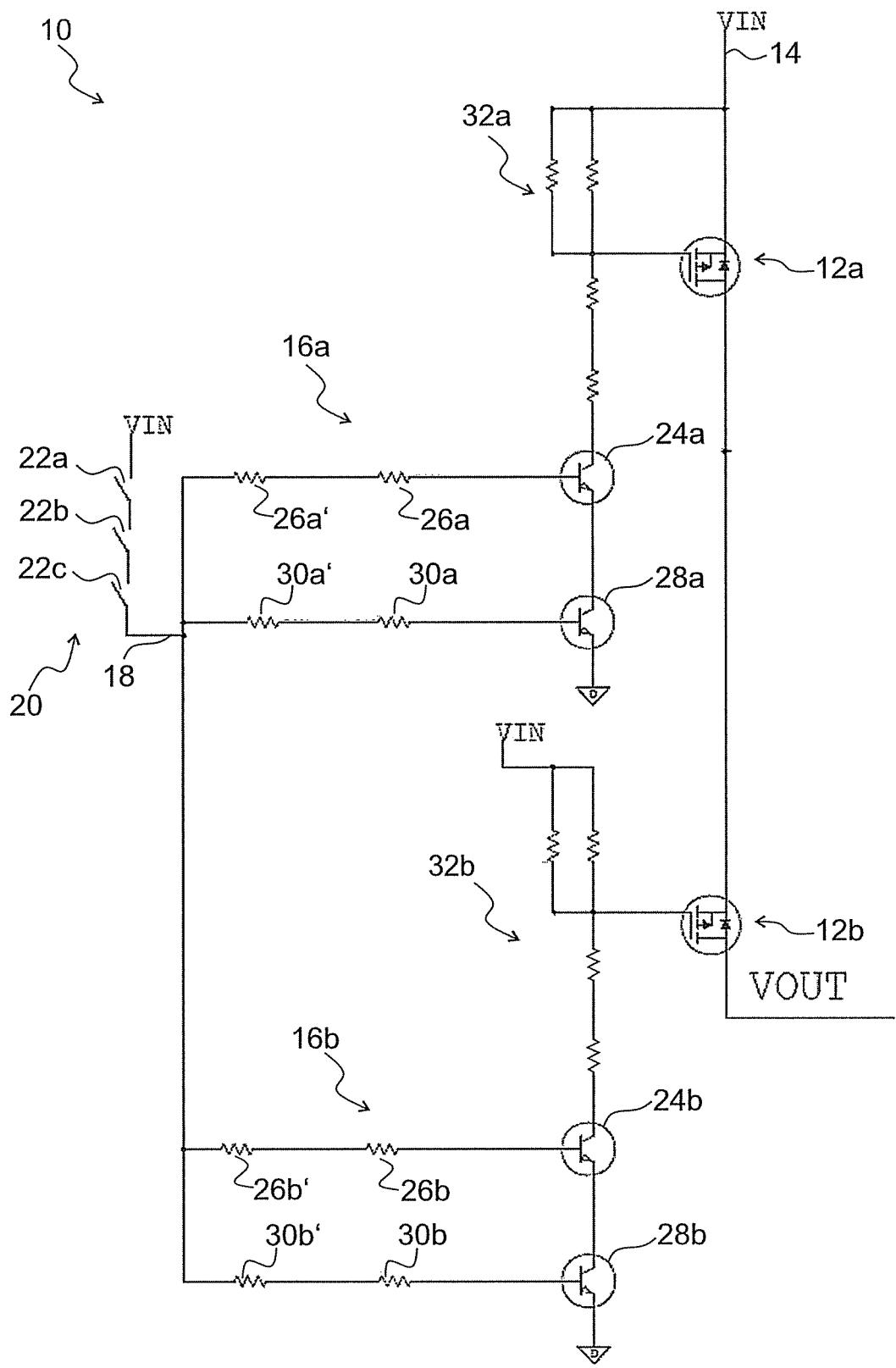
FIG. 2 is a schematic circuit diagram of another example interlock circuit.

FIG. 2 is a schematic circuit diagram which illustrates the components of the example interlock circuit 10 of FIG. 1 in additional detail. Corresponding components in the circuit diagrams of FIGS. 1 and 2 share the same reference numerals.

As can be taken from FIG. 2, the first control unit 16a comprises a first semiconductor transistor 24a connected to the gate electrode of said first semiconductor transistor element 12a. A gate electrode of said first semiconductor transistor 24a is in turn connected to the trigger line 18 via two first resistor elements 26a, 26a'. The first control unit 16a further comprises a second semiconductor transistor 28a connected in series with said first semiconductor transistor 24a of said first control unit 16a to said gate electrode of said first semiconductor transistor element 12a. Second resistor elements 30a, 30a' can be connected in series between a gate electrode of said second semiconductor transistor 28a and said trigger line 18.

Hence, as can be taken from FIG. 2, the first control unit 16a comprises two independent control paths for the trigger signal, a first control path comprising the first resistor elements 26a, 26a' and the first semiconductor transistor 24a, and a second control path comprising the second resistor elements 30a, 30a' and the second semiconductor transistor 28a.

The first control circuit 16a hence provides alternative and redundant signal paths across the first resistor elements 26a', 26a and first semiconductor transistor 24a, or across the second resistor elements 30a', 30a and the second semiconductor transistor 28a to control the first semiconductor transistor element 12a. This allows to provide redundancy, and ensures a reliable interlock even in situations in which one or several of the elements 24a, 26a, 26a' in the first control path, or one or several of the elements 28a, 30a, 30a' in the second control path should fail.

The second control unit 16b connected to the gate electrode of the second semiconductor transistor element 12b generally corresponds in design and functionality to the first control unit 16a, and comprises a first control path with a first semiconductor transistor 24b and two first transistor elements 26b, 26b' connected in series, and a second control path comprising a second semiconductor transistor element 28b and two second resistor elements 30b, 30b' connected in series. The first control path comprising the elements 24b, 26b and 26b', and the second control path comprising the elements 28b, 30b, 30b' can be connected in parallel so to provide redundancy in case one or several of the elements and either the first control path or the second control path of the second control unit 16b should fail.

As can be further taken from the circuit diagram of FIG. 2, the first and second control units 16a, 16b can be supplied by the input voltage VIN of the supply line 14 via respective first and second control unit supply lines 32a, 32b, respectively. Each of the first control unit supply line 32a and the second control unit supply line 32b comprises a plurality of resistor elements. In the circuit diagram of FIG. 2, the input supply voltage VIN also supplies the trigger unit 20, whereas VOUT denotes the output voltage of the supply line 14 at the output of the second semiconductor transistor element 12b.

Figure 3:
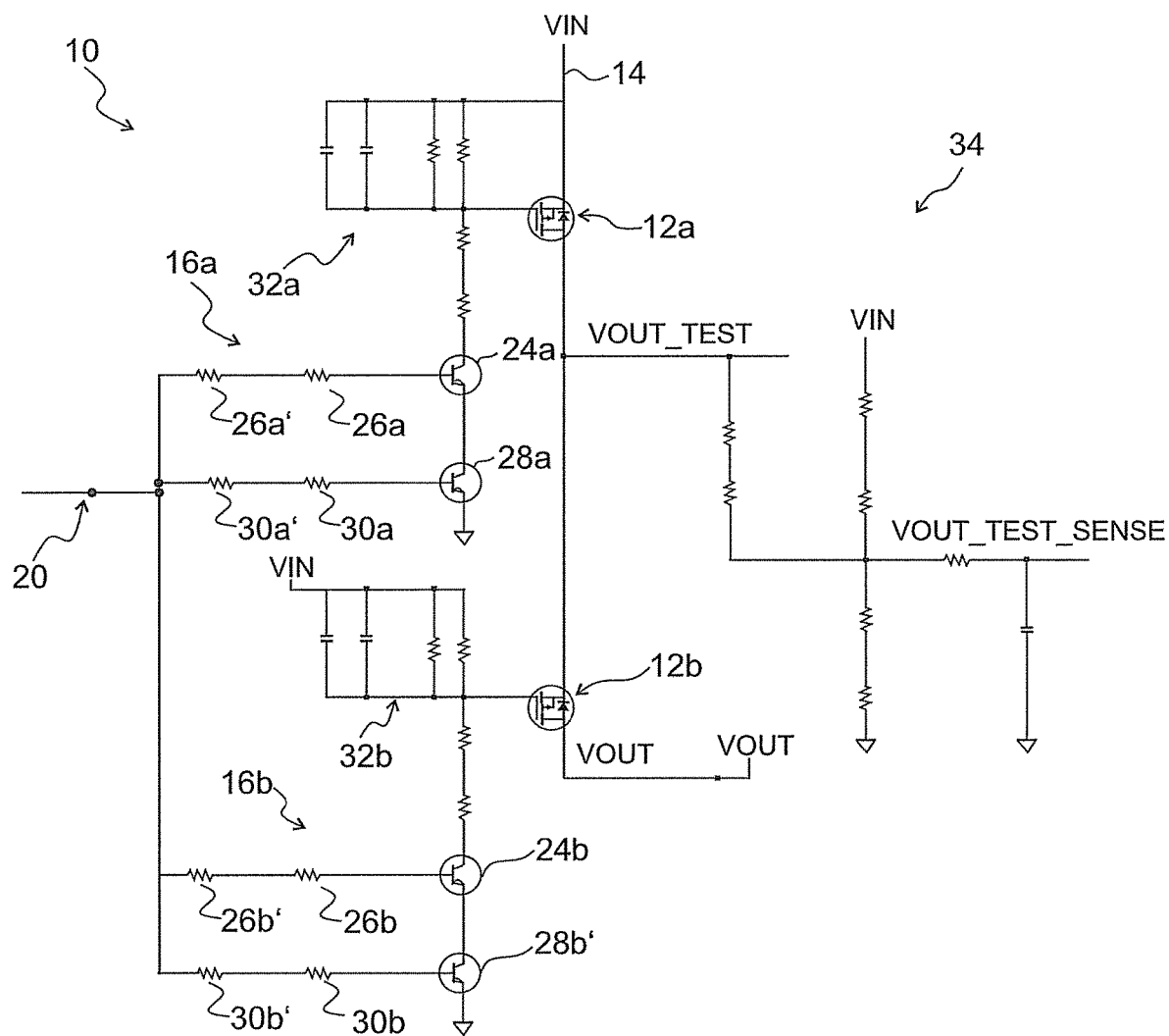
FIG. 3 is a schematic circuit diagram of an example interlock circuit with a diagnostics unit.

FIG. 3 is a circuit diagram of an example interlock circuit 10 that largely corresponds to the interlock circuit described above with reference to FIGS. 1 and 2, respectively, and the same reference numerals are used to designate like components.

However, in addition the interlock circuit 10 of FIG. 3 comprises a diagnostics unit 34 adapted to test the functionality of the first and second semiconductor transistor elements 12a, 12b and the first and second control units 16a, 16b.

As can be taken from FIG. 3, the diagnostics unit 34 is powered by means of the input voltage VIN, and is electrically connected to the supply line 14 between the first semiconductor transistor element 12a and the second semiconductor transistor element 12b. At this electrical connection, the diagnostics unit 34 applies a voltage VOUT_TEST, thereby serving as a polarization circuit for the first and second semiconductor transistor elements 12a, 12b. The trigger unit 20 may now be activated to provide a trigger signal and deactivate the first and second semiconductor transistor elements 12a, 12b. An output voltage VOUT_TEST_SENSE may be sensed at an output node of the diagnostics unit 34, and may allow to infer malfunctions of the first and second semiconductor transistor elements 12a, 12b. In particular, comparison of the output test voltage VOUT_TEST_SENSE against pre-determined reference voltages allows to detect potential failures in the first and second semiconductor transistor elements 12a, 12b, or in the respective first and second control units 16a, 16b. If a failure is detected, the interlock circuit 10 may be partially or completely replaced, thereby further enhancing the reliability of the safety interlock circuit 10.

Figure 4:
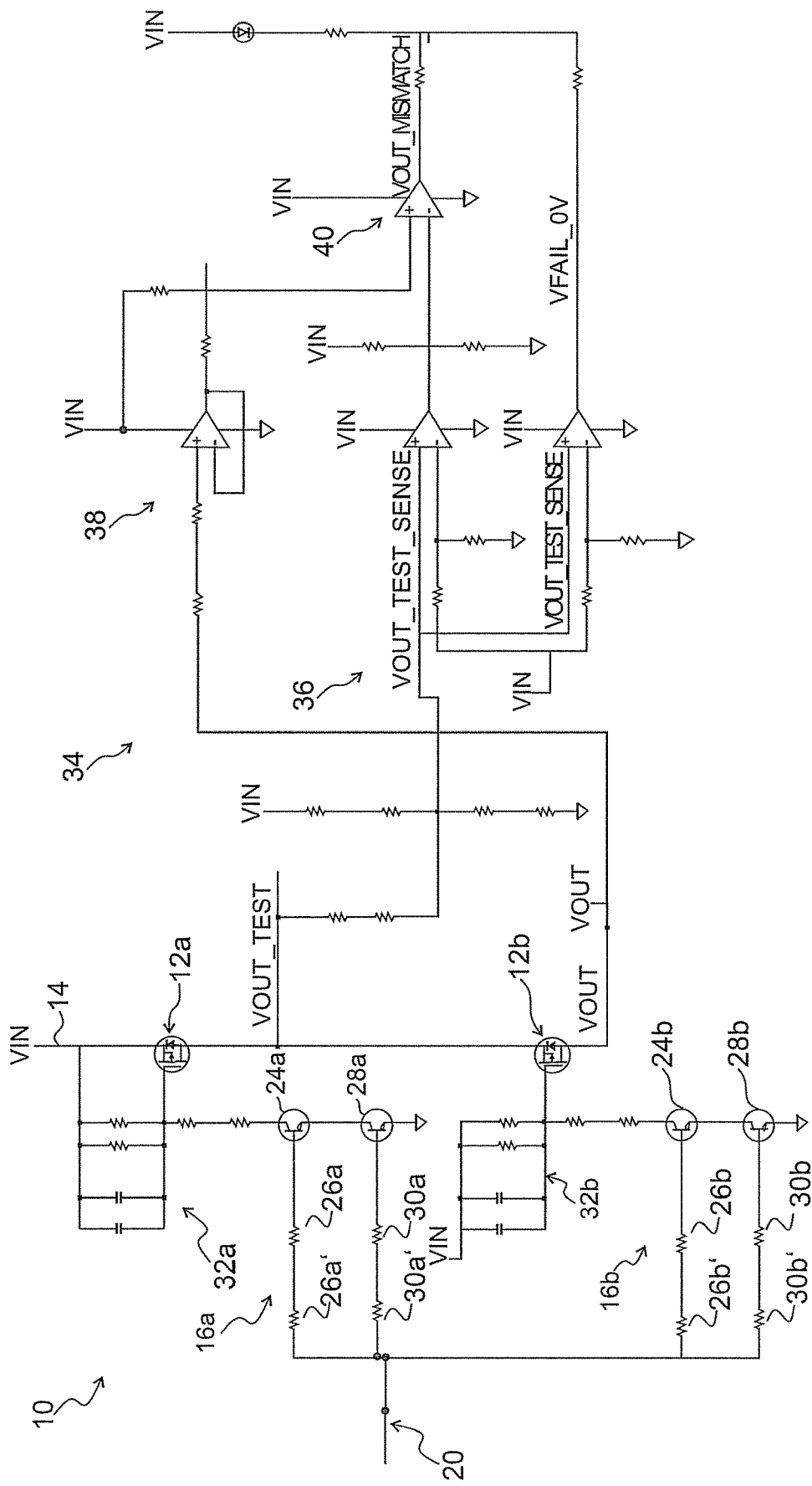
FIG. 4 is a schematic circuit diagram of another example interlock circuit with a diagnostics unit.

FIG. 4 is schematic circuit diagram that generally corresponds to FIG. 3, but shows the circuit configuration of the diagnostics unit 34 in additional detail. The same reference numerals are used to designate corresponding components.

As can be taken from FIG. 4, the diagnostics unit 34 comprises a first comparator circuit 36 supplied by the input voltage VIN and connected to the supply line 14 at the position between the first semiconductor transistor element 12a and the second semiconductor transistor element 12b. The first comparator circuit 36 provides at its output a voltage VFAIL_0V. The diagnostics unit 34 further comprises a second comparator circuit 38 supplied by the input voltage YIN and connected to the output voltage VOUT of the supply line 14. The output of the second comparator circuit 38 is provided to a third comparator circuit 40, and compared these with the output of the first comparator circuit 36 to yield an output voltage VOUT_MISMATCH.

Table 1 shows the resulting voltages VOUT_TEST, VOUT_SENSE, VOUT_MISMATCH, and VFAIL_0V obtained in the interlock circuit 10 according to FIG. 4 for the example of an input voltage VIN of 32 V, both for the normal operation in which the first and second semiconductor transistor elements 12a, 12b function properly and for configurations in which failures occur either in the first or second semiconductor transistor elements 12a, 12b. As can be taken from a comparison of the resulting voltage values, the detected voltages in the single fault condition state can be different from the normal state operation, and hence from a comparison the single fault conditions may be reliably inferred. For instance, a fault condition may be inferred if it is detected that the voltage VOUT_MISMATCH differs from 32 V, for instance falls below 25 V. Similarly, a fault condition may be concluded if the voltage VFAIL_0V falls below 32 V, and a threshold for detecting a failure may be set at a voltage lower than 32 V, such as 25 V. In general, threshold voltages may be set for the plurality of detected voltage values VOUT_SENSE, VOUT_MISMATCH and VFAIL_0V to detect failures and distinguish between different single fault condition states.

code. For example, various examples of the present disclosure can be implemented as computer executable code executed by a processor that cause the processor to be configured to perform the functionality of various components described herein. In one particular example, examples of the present disclosure can be implemented by a processor executing computer executable code that includes instructions that cause the processor to perform a method with some or all of the features described above. In one example, such computer executable code can be stored on transitory or non-transitory computer readable media.

In general, an interlock circuit according to the disclosure may comprise a plurality of semiconductor switching units electrically connected in series or electrically connectable in series in a supply line, a plurality of control units electrically connected to said plurality of semiconductor switching units, and a trigger unit electrically connected to said plurality of control units. Each said control unit may activate or

TABLE 1

| Safety Interlock State | Switch | Safety Interlock Mosfets 12a | 12b | Vout_test | followsVout test Vout_TEST_sense | Vout | Vout_SENSE | Vout_MISMATCH | VFAIL_OV |
|---|---|---|---|---|---|---|---|---|---|
| Normal State | closed | OK | OK | 32 V | 16 V | 32 V | 16 V | 32 V | 32 V |
|  | open | OK | OK | 16 V | 16 V | 0 V | 0 V | 32 V | 32 V |
| Single Fault condition State | closed | Fail Open | OK | 0 | 0 | 0 V | 0 V | 0 | 0 |
|  | open | Fail Open | OK |  |  |  |  |  |  |
|  | open | Fail Closed | OK | 32 V | 16 V | 0 V | 0 V | 0 | 32 V |
|  | closed | Fail Closed | OK |  |  |  |  |  |  |
|  | closed | OK | Fail Open | 32 V | 16 V | 0 V | 0 V | 0 | 32 V |
|  | open | OK | Fail Open |  |  |  |  |  |  |
|  | open | OK | Fail Closed | 0 V (load avoid 16 V) | 0 V | 0 V | 0 V | do not care | 0 |
|  | closed | OK | Fail Closed |  |  |  |  |  |  |

Figure 5:
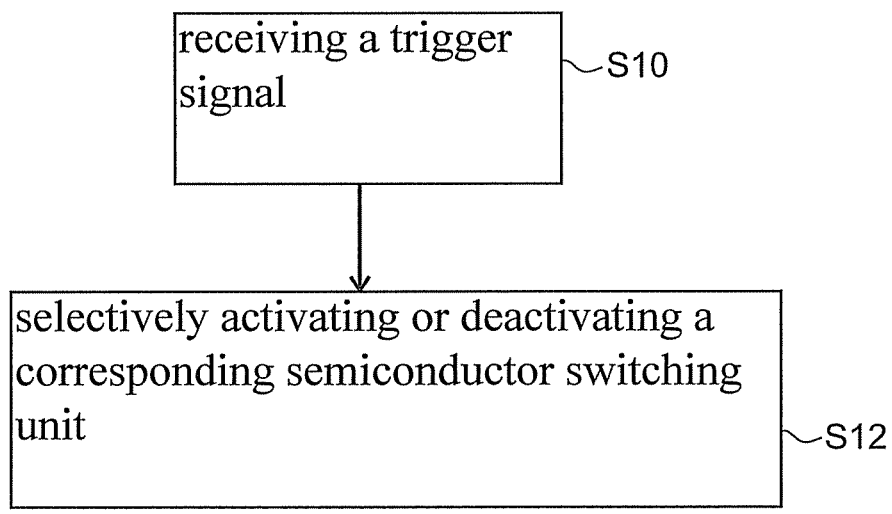
FIG. 5 is a flow diagram illustrating an example interlock method.

FIG. 5 is a flow diagram that illustrates an example of an interlock method according to the present disclosure.

At S10, a trigger signal is received. In particular, a trigger signal may be received at a plurality of control units, such as the first and second control units 16a, 16b described above with reference to FIGS. 1 to 4. For instance, said trigger signal may be transmitted by the trigger unit 20 and may indicate that one or several of the switch elements 22a to 22c have been opened.

At S12, a corresponding semiconductor switching unit may be selectively activated or deactivated. As an example, at S12, by means of each said control unit, a corresponding semiconductor switching unit is selectively activated or deactivated in response to said trigger signal, wherein the semiconductor switching units can be electrically connected in series in a supply line of an electrical appliance.

For example, with reference to the circuit diagrams of FIGS. 1 to 4, the control units 16a, 16b may selectively activate or deactivate the corresponding first and second semiconductor transistor elements 12a, 12b in response to the trigger signal, wherein the first and second semiconductor transistor elements 12a, 12b are electrically connected in series in the supply line 14.

A method with some or all of the features described above can be implemented in hardware. A hardware implementation is particularly reliable and failure-resistant.

However, the disclosure is not so limited, and alternatively, the method may be fully or partially implemented in any combination of hardware and computer executable deactivate a corresponding semiconductor switching unit in response to a trigger signal received from said trigger unit.

Semiconductor switching units reduce the manufacturing complexity and costs of the interlock circuit. At the same time, the use of a plurality of control units that are electrically connected to a plurality of corresponding semiconductor switching units provides a fully redundant interlock circuit that allows to reliably switch off said electrical appliance in response to said trigger signal even in situations in which one of the semiconductor switching units and/or one of the control units should fail.

Said supply line may be a supply line of an electrical appliance. Said electrical appliance may be any device or machinery for which a safety interlock functionality may be desired, or part of said device or machinery. For example, said electrical appliance may comprise a printing device, or part of a printing device.

Said supply line may be any power or control line of said electrical appliance adapted to switch off or deactivate at least part of said electrical appliance.

Said activation or said deactivation of said semiconductor switching unit may interrupt said supply line of said electrical appliance, thereby deactivating said electrical appliance in response to said trigger signal received from said trigger unit.

Said trigger signal may be any signal signaling an event in response to which an interlock of said electrical appliance is desired. For instance, said trigger unit may comprise a sensor unit, and said sensor unit may be adapted to sense a dangerous operation condition of said electrical appliance that may cause harm or injury to a user, such as an open lid or cover.

Said interlock circuit may comprise a plurality of interlock paths, each interlock path comprising a control unit and a corresponding semiconductor switching unit electrically connected in series. Said interlock paths may be electrically connected in parallel to said trigger unit.

In an example, said semiconductor switching units comprise a semiconductor transistor element, such as a field effect transistor, such as a MOSFET.

Semiconductor transistor elements permit reliable switching operations, and are available off-the-shelf in a large variety of configurations and at low cost, thereby significantly reducing the manufacturing complexity and costs of the interlock circuit.

In an example, the interlock circuit comprises two semiconductor switching units and two control units, wherein a first control unit is electrically connected to a first semiconductor switching unit, and a second control unit is electrically connected to a second semiconductor switching unit.

An interlock circuit with two semiconductor switching units and two control units provides two independent interlock paths to deactivate said electrical appliance in response to said trigger signal, and thereby provides redundancy against failures.

For example, said first control unit may activate or deactivate said first semiconductor switching unit in response to said trigger signal received from said trigger unit, and said second control unit may activate or deactivate said second semiconductor switching unit in response to said trigger signal received from said trigger unit.

In an example, said plurality of control units may be provided and connected redundantly, so that a first control unit activates or deactivates a corresponding first semiconductor switching unit in response to said trigger signal even if a second control unit fails to activate or deactivate a corresponding second semiconductor switching unit in response to said trigger signal, wherein said second control unit is different from said first control unit and said second semiconductor switching unit is different from said first semiconductor switching unit.

Providing redundancy with two independent control units and two corresponding independent semiconductor switching units allows to reduce the probability of a failure of the interlock system from p to $p^2$, wherein p denotes the probability that a failure occurs in a single control unit or semiconductor switching unit.

In an example, said plurality of control units may be spatially separated from one another. In one particular example, the plurality of control units may be spatially separated by at least 2.5 mm.

Similarly, said plurality of semiconductor switching units may be spatially separated from one another. In one particular example, the plurality of semiconductor switching unites can be spatially separated by at least 2.5 mm.

The spatial separation can help ensure that the control units and switching units operate and fail independently, and thereby enhances the failure tolerance of the interlock circuit.

Each said control unit may comprise a resistor element and a semiconductor transistor element electrically connected in series.

The series connection of at least one resistor element and at least one semiconductor transistor element allows for an efficient and reliable control of the corresponding semiconductor switching unit in response to a trigger signal. In particular, the series connection can avoid undesired connections in case of a short/open failure in one element. Moreover, the control unit in accordance with the example can be fabricated reliably and at low cost.

Each said control circuit may comprise a least two independent control paths for activating or deactivating said corresponding semiconductor switching units in response to said trigger signal.

Two independent control paths provide redundancy also in the control circuits, thereby increasing the reliability of the interlock circuit.

Each control path may comprise at least one resistor element and at least one semiconductor transistor element.

In an example, each said control circuit comprises a plurality of resistor elements and a plurality of semiconductor transistor elements, wherein a first resistor element is electrically connected in series with a first semiconductor transistor element, and a second resistor element is electrically connected in series with a second semiconductor transistor element, in parallel with said series connection of said first resistor element and said first semiconductor transistor element.

By means of the parallel connection according to the example, two redundant control paths may be provided in each said control circuit, thereby further enhancing the failure resilience.

In an example, said trigger unit comprises at least one switch element. For example, the trigger unit can include a plurality of switch elements connected in series.

Each said switch element may be placed at a safety-relevant component of said electrical appliance, such as a lid or cover, and may open in response to a safety risk. Said opening of said switch element may interrupt an electrical circuit, and said interruption may constitute or activate a trigger signal in response to which said control unit activates or deactivates said corresponding semiconductor switching unit.

In an example, an interlock circuit further comprises a diagnostics unit electrically connected or electrically connectable to said plurality of semiconductor switching units and/or to said plurality of control units. Said diagnostics unit may test a functionality of said semiconductor switching units or said control units, respectively.

For instance, by means of said diagnostics unit, a user of said electrical appliance may test whether said interlock circuit is still fully operational. In case said diagnostic unit reveals a failure in said interlock circuit, said interlock circuit may be replaced, thereby further enhancing the safety level provided by said interlock system.

In an example, said diagnostics unit may be electrically connected or electrically connectable to said supply line.

An electrical connection of said diagnostics unit to said supply line may allow to test the functionality of said semiconductor switching units connected in series in said supply line, and may likewise allow to test the functionality of said corresponding control units via said respective semiconductor switching units.

In an example, said diagnostics unit comprises a plurality of comparator circuits. Said comparator circuits may allow to compare a voltage value obtained in said interlock circuit in response to an applied test voltage against a predetermined voltage value, thereby allowing to assess said functionality of said interlock circuit.

An interlock method according to the present disclosure may comprise receiving a trigger signal at a plurality of control units, and, by means of each said control unit, selectively activating or deactivating a corresponding semiconductor switching unit in response to said trigger signal, said semiconductor switching units being electrically connected in series in a supply line.

Said supply line may be the supply line of an electrical appliance.

In an example, selectively activating or deactivating said corresponding semiconductor switching unit comprises activating or deactivating a first switching unit by means of a first control unit in response to said trigger signal, and redundantly activating or deactivating a second switching unit electrically connected in series with said first switching unit by means of a second control signal in response to said trigger signal.

In an example, said method further comprises testing a functionality of said control units and/or said semiconductor switching units, wherein testing said functionality may comprise applying a test voltage to said supply line.

Testing said functionality may comprise activating said trigger signal.

In an example, testing said functionality may comprise determining an output voltage. In one example, the output voltage can be obtained in response to applying said test voltage to said supply line, and comparing said output voltage against a predetermined voltage range or voltage value.

The present disclosure further relates to a computer-readable program comprising computer-readable instructions, or to a non-transitory computer-readable medium comprising computer-readable instructions, wherein said instructions, when executed by a processor or computer, cause the processor or computer to be configured to test a functionality of a plurality of semiconductor switching units provided in series in a supply line of an electrical appliance, wherein said test comprises applying a test voltage to said supply line, determining an output voltage, and comparing said output voltage against a predetermined voltage range.

The description of the examples and the figures merely serve to illustrate the disclosure, but should not be understood to imply any limitation. The scope is to be determined solely by means of the appended claims.

REFERENCE SIGNS 10 interlock circuit
12*a*, 12*b* first, second semiconductor transistor elements
14 supply line
16*a*, 16*b* first, second control units
18 trigger line
20 trigger unit
22*a*, 22*b*, 22*c* switch elements of trigger unit 20
24*a* first semiconductor transistor of first control unit 16*a*
24*b* first semiconductor transistor of second control unit 16*b*
26*a*, 26*a*' first resistor elements of first control unit 16*a*
26*b*, 26*b*' first resistor elements of second control unit 16*b*
28*a* second semiconductor transistor of first control unit 16*a*
28*b* second semiconductor transistor of second control unit 16*b*
30*a*, 30*a*' second resistor elements of first control unit 16*a*
30*b*, 30*b*' second resistor elements of second control unit 16*b*
32*a* first control unit supply line for first control unit 16*a*
32*b* second control unit supply line for second control unit 16*b*
34 diagnostics unit
36 first comparator circuit of diagnostics unit 34
38 second comparator circuit of diagnostics unit 34
40 third comparator circuit of diagnostics unit 34

The invention claimed is:

1. An interlock circuit, comprising:
a plurality of semiconductor switching units electrically connected or connectable in series in a supply line;
a plurality of control units electrically connected to said plurality of semiconductor switching units, wherein each control unit comprises at least two independent control paths for a trigger signal;
a trigger unit electrically connected to said plurality of control circuits; and
a diagnostics unit electrically connected to said plurality of control units to test a functionality of said control units;
wherein each said control unit activates or deactivates a corresponding semiconductor switching unit in response to a trigger signal received from said trigger unit.

2. The interlock circuit according to claim 1, wherein said semiconductor switching units comprise a semiconductor transistor element.

3. The interlock circuit according to claim 1, wherein said plurality of control units are provided and connected redundantly so that a first control unit in the plurality of control units activates or deactivates a corresponding first semiconductor switching unit in the plurality of semiconductor switching units in response to said trigger signal even if a second control unit in the plurality of control units fails to activate or deactivate a corresponding second semiconductor switching unit in the plurality of semiconductor switching units in response to said trigger signal, wherein said second control unit is different from said first control unit and said second semiconductor switching unit is different from said first semiconductor switching unit.

4. The interlock circuit according to claim 1, wherein each said control unit comprises a resistor element and a semiconductor transistor element electrically connected in series.

5. The interlock circuit according to claim 1, wherein each control circuit in the plurality of control units comprises a plurality of resistor elements and a plurality of semiconductor transistor elements, wherein a first resistor element is electrically connected in series with a first semiconductor transistor element, and a second resistor element is electrically connected in series with a second semiconductor transistor element, in parallel with said series connection of said first resistor element and said first semiconductor transistor element.

6. The interlock circuit according to claim 1, wherein said trigger unit comprises a plurality of switch elements connected in series.

7. The interlock circuit according to claim 1, wherein said diagnostics unit is electrically connected or electrically connectable to said supply line.

8. The interlock circuit according to claim 1, wherein said diagnostics unit comprises a plurality of comparator circuits.

9. The interlock circuit according to claim 1, wherein said supply line is disposed in a printing device or part of a printing device.

10. The interlock circuit of claim 1, wherein the trigger unit comprises a number of switches, at least one of which is tripped by movement of a cover indicating an unsafe condition caused by an interior of a corresponding machine being potentially exposed by movement of the cover.

11. The interlock circuit of claim 1, wherein the trigger unit comprises a number of switches, at least one of which is tripped by occurrence of a potentially unsafe condition in a corresponding machine, the tripping of the at least one switch causing the trigger signal causing a corresponding control unit to deactivate one of the semiconductor switching units to interrupt power in the supply line.

12. The interlock circuit of claim 11, wherein the number of switches comprises a plurality of switches connected in series, each switch located to be tripped by occurrence of a different potentially unsafe condition.

13. The interlock circuit of claim 1, wherein any one of the control units deactivating any one of the switching units will interrupt power in the supply line, allowing the control units and switching units to be redundant of each other.

14. The interlock circuit of claim 1, wherein the plurality of control units are connected in parallel with respect to the supply line.

15. The interlock circuit of claim 1, wherein a first semiconductor switching unit and a second semiconductor switching unit are separated by at least 2.5 millimeters (mm).

16. An interlock method, comprising:
receiving a trigger signal at a plurality of control units, wherein:
each control unit comprises at least two independent control paths for the trigger signal; and
each control path comprises multiple resistor elements and a transistor;
by means of each control unit in the plurality of control units, selectively activating or deactivating a corresponding semiconductor switching unit in response to said trigger signal, said semiconductor switching units being electrically connected in series in a supply line.

17. The method according to claim 16, wherein selectively activating or deactivating said corresponding semiconductor switching unit comprises activating or deactivating a first switching unit in the plurality of switching units by means of a first control unit in the plurality of control units in response to said trigger signal, and redundantly activating or deactivating a second switching unit in the plurality of switching units electrically connected in series with said first switching unit by means of a second control signal in the plurality of control units in response to said trigger signal.

18. The method according to claim 16, further comprising testing a functionality of said plurality of control units or said plurality of semiconductor switching units, wherein testing said functionality comprises applying a test voltage to said supply line.

19. The method according to claim 18, wherein testing said functionality comprises:
determining an output voltage of said interlock circuit; and
comparing said output voltage against a predetermined voltage range or voltage value.

20. A non-transitory computer-readable medium comprising computer-readable instructions, wherein said instructions, when executed by a processor cause the processor to operate an interlock circuit comprising a plurality of semiconductor switching units provided in series in a supply line with a plurality of control units electrically connected to said plurality of semiconductor switching units, wherein each control unit comprises at least two independent control paths;
the instructions, when executed by the processor, causing the processor to:
receive a trigger signal; and
selectively activate or deactivate a corresponding semiconductor switching unit using a corresponding control unit in response to receiving the trigger signal.

* * * * *